(12) United States Patent
Sahu et al.

(10) Patent No.: US 9,306,570 B1
(45) Date of Patent: Apr. 5, 2016

(54) CONTINUOUS DIFFUSION CONFIGURABLE STANDARD CELL ARCHITECTURE

(71) Applicant: QUALCOMM Incorporated, San Diego, CA (US)

(72) Inventors: Satyanarayana Sahu, San Diego, CA (US); Joshua Lance Puckett, Cary, NC (US); Ohsang Kwon, San Diego, CA (US); William James Goodall, III, Cary, NC (US); Benjamin John Bowers, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/603,262

(22) Filed: Jan. 22, 2015

(51) Int. Cl.
| | |
|---|---|
| H03K 19/177 | (2006.01) |
| H01L 25/00 | (2006.01) |
| H03K 19/0175 | (2006.01) |
| H03K 19/20 | (2006.01) |
| H01L 27/118 | (2006.01) |

(52) U.S. Cl.
CPC .. *H03K 19/017581* (2013.01); *H01L 27/11807* (2013.01); *H03K 19/17728* (2013.01); *H03K 19/17736* (2013.01); *H03K 19/20* (2013.01); *H01L 2027/11874* (2013.01)

(58) Field of Classification Search
None
See application file for complete search history.

(56) References Cited

U.S. PATENT DOCUMENTS

| 7,137,094 B2 | 11/2006 | Tien | |
|---|---|---|---|
| 7,709,301 B2 | 5/2010 | Bosshart et al. | |
| 8,307,318 B2 | 11/2012 | Kim et al. | |
| 8,446,176 B1 * | 5/2013 | Yang et al. | 326/103 |
| 2006/0040460 A1 | 2/2006 | Kakimura et al. | |
| 2014/0183647 A1 * | 7/2014 | Lu et al. | 257/369 |

* cited by examiner

*Primary Examiner* — Anh Tran
(74) *Attorney, Agent, or Firm* — Arent Fox LLP

(57) ABSTRACT

At least one configurable circuit cell with a continuous active region includes at least one center subcell, a first-side subcell, and a second-side subcell. Each center subcell includes first and second pMOS transistors and first and second nMOS transistors. The first pMOS transistor has a first-pMOS-transistor gate, source, and drain. The first-pMOS-transistor source is coupled to a first voltage source. The second pMOS transistor has a second-pMOS-transistor gate, source, and drain. The second-pMOS-transistor source is coupled to the first voltage source. The first-pMOS-transistor drain and the second-pMOS-transistor drain are a same drain. The first nMOS transistor has a first-nMOS-transistor gate, source, and drain. The first-nMOS-transistor source is coupled to a second voltage source. The second nMOS transistor has a second-nMOS-transistor gate, source, and drain. The second-nMOS-transistor source is coupled to the second voltage source. The first-nMOS-transistor drain and the second-nMOS-transistor drain are a same drain.

29 Claims, 13 Drawing Sheets

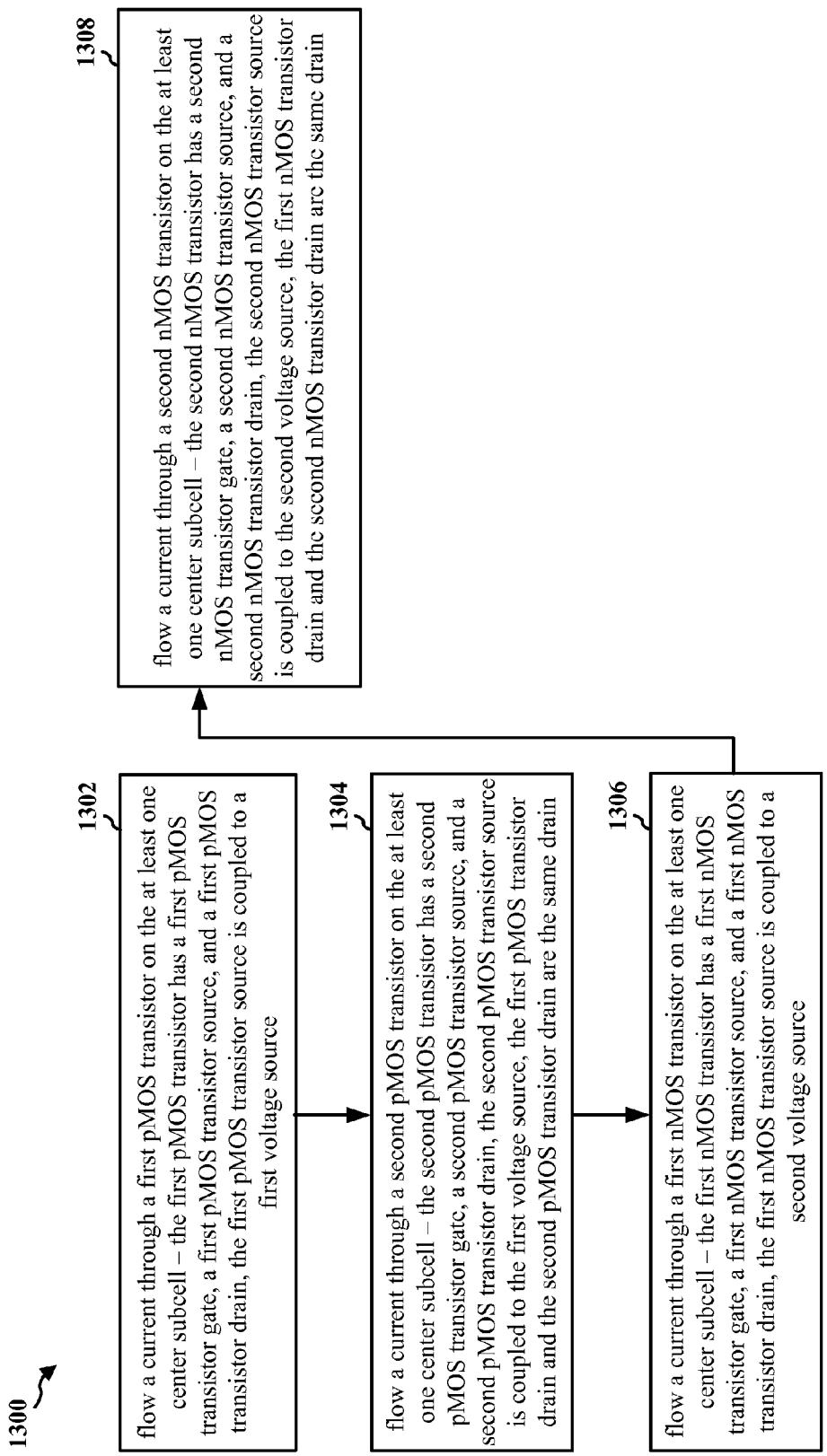

CONTINUOUS DIFFUSION CONFIGURABLE STANDARD CELL ARCHITECTURE

BACKGROUND

1. Field

The present disclosure relates generally to a layout construction, and more particularly, to a continuous diffusion configurable standard cell architecture.

2. Background

A standard cell is an integrated circuit that may be implemented with digital logic. An application-specific integrated circuit (ASIC), such as a system-on-a-chip (SoC) device, may contain thousands to millions of standard cells. Increasing a transistor density of configurable standard cells within ASICs is beneficial. Accordingly, there is a need for a configurable standard cell architecture which provides for increasing a transistor density within configurable standard cells in ASICs.

SUMMARY

In an aspect of the disclosure, a semiconductor die, including at least one configurable circuit cell, includes at least one center subcell, a first side subcell, and a second side subcell. Each of the at least one center subcell includes a first p-type metal oxide semiconductor (pMOS) transistor, a second pMOS transistor, a first n-type metal oxide semiconductor (nMOS) transistor, and a second nMOS transistor. The first pMOS transistor has a first pMOS transistor gate, a first pMOS transistor source, and a first pMOS transistor drain. The first pMOS transistor source is coupled to a first voltage source. The second pMOS transistor has a second pMOS transistor gate, a second pMOS transistor source, and a second pMOS transistor drain. The second pMOS transistor source is coupled to the first voltage source. The first pMOS transistor drain and the second pMOS transistor drain are the same drain. The first nMOS transistor has a first nMOS transistor gate, a first nMOS transistor source, and a first nMOS transistor drain. The first nMOS transistor source is coupled to a second voltage source. The second nMOS transistor has a second nMOS transistor gate, a second nMOS transistor source, and a second nMOS transistor drain. The second nMOS transistor source is coupled to the second voltage source. The first nMOS transistor drain and the second nMOS transistor drain are the same drain. The first side subcell is on a first side of the at least one center subcell. The second side subcell is on a second side of the at least one center subcell. The at least one center subcell, the first side subcell, and the second side subcell have a continuous active region.

In an aspect of the disclosure, a semiconductor die includes at least one configurable circuit cell. The at least one configurable circuit cell includes at least one center subcell, a first side subcell on a first side of the at least one center subcell, and a second side subcell on a second side of the at least one center subcell. On the at least one configurable circuit cell, a current is flowed through a first pMOS transistor on the at least one center subcell. The first pMOS transistor has a first pMOS transistor gate, a first pMOS transistor source, and a first pMOS transistor drain. The first pMOS transistor source is coupled to a first voltage source. In addition, a current is flowed through a second pMOS transistor on the at least one center subcell. The second pMOS transistor has a second pMOS transistor gate, a second pMOS transistor source, and a second pMOS transistor drain. The second pMOS transistor source is coupled to the first voltage source. The first pMOS transistor drain and the second pMOS transistor drain are the same drain. In addition, a current is flowed through a first nMOS transistor on the at least one center subcell. The first nMOS transistor has a first nMOS transistor gate, a first nMOS transistor source, and a first nMOS transistor drain. The first nMOS transistor source is coupled to a second voltage source. In addition, a current is flowed through a second nMOS transistor on the at least one center subcell. The second nMOS transistor has a second nMOS transistor gate, a second nMOS transistor source, and a second nMOS transistor drain. The second nMOS transistor source is coupled to the second voltage source. The first nMOS transistor drain and the second nMOS transistor drain are the same drain. The at least one center subcell, the first side subcell, and the second side subcell have a continuous active region.

BRIEF DESCRIPTION OF THE DRAWINGS

FIG. 13 is a flow chart of an exemplary method.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
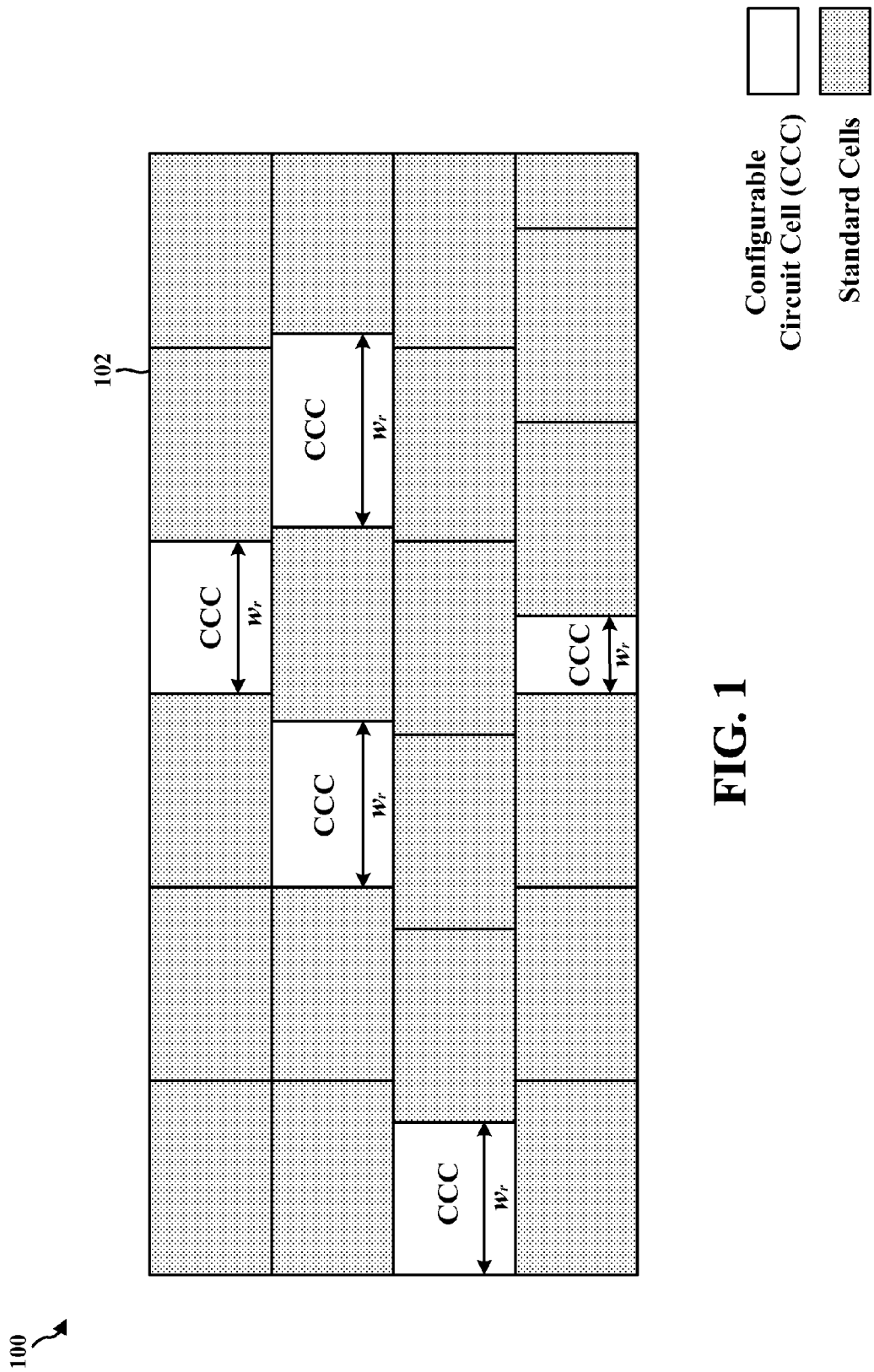
FIG. 1 is a diagram illustrating a semiconductor die including a plurality of standard cells and configurable circuit cells.

FIG. 1 is a diagram 100 illustrating a semiconductor die 102 including a plurality of standard cells and configurable circuit cells. Standard cells are aligned in rows on the semiconductor die, leaving some spaces/gaps $w_r$ in between the standard cells. In the spaces between the standard cells on the semiconductor die 102, configurable circuit cells (CCCs) may be located. The configurable circuit cells may also be standard cells. The configurable circuit cells may be referred to as engineering change order (ECO) cells, as such cells may be reconfigured upon an engineering change order. The configurable circuit cells may initially be configured as decoupling capacitors (DCAPs) in capacitor cells, which may provide voltage stability to the supply voltages supplying voltage to the ASICs on the semiconductor die. Subsequently, some of the configurable circuit cells may be reconfigured as other cells that are determined to be needed to improve the performance of the circuit.

A set of masks are created for producing ASICs on the semiconductor die 102. The set of masks may configure each of the configurable circuit cells as capacitor cells. Upon testing of the ASICs on the semiconductor die 102, it may be determined that additional non-capacitor cells are needed to improve the performance of the ASICs. A subset of the set of masks (e.g., for some vias and metal layers) may be replaced in order to configure one or more of the configurable circuit cells to include different functionality, such as for example, a buffer, an inverter, a flip flop, a latch, an AND gate, an OR gate, a NAND gate, a NOR gate, etc., as determined to be needed.

Figure 2:
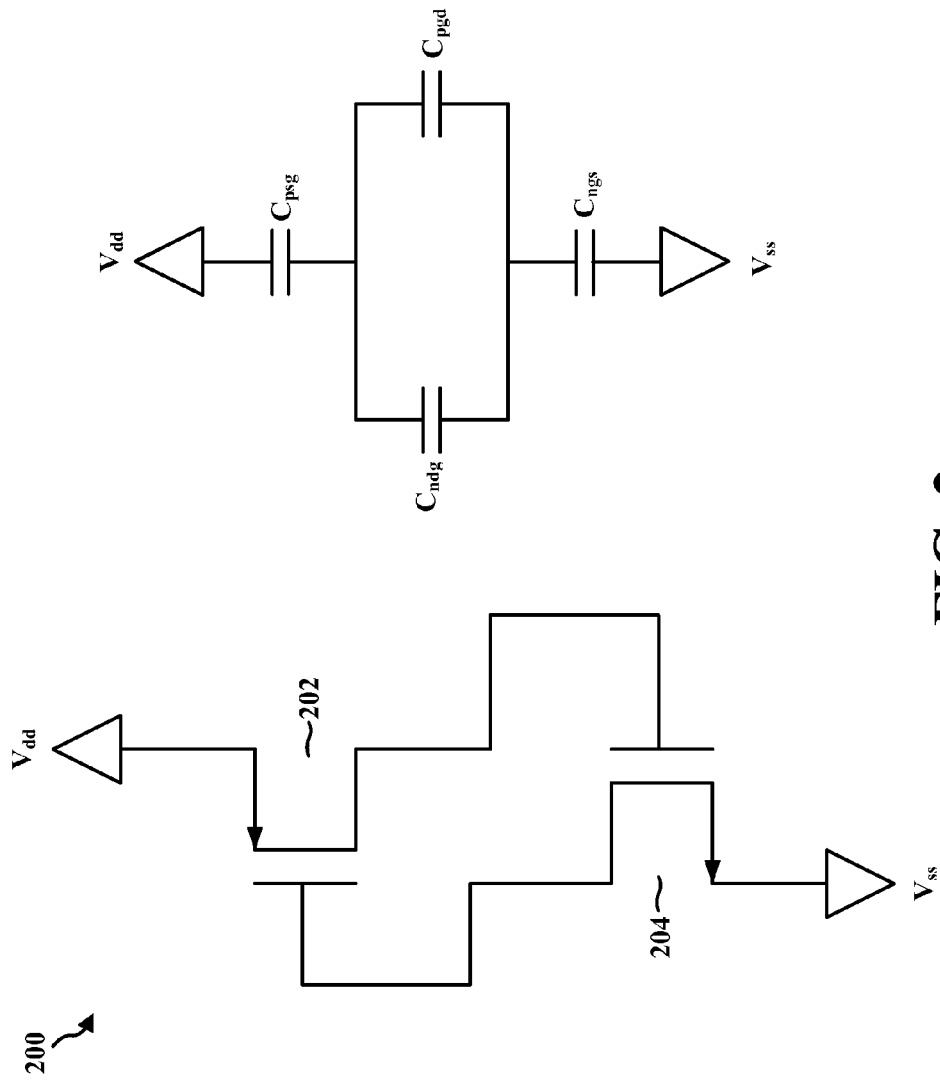
FIG. 2 is a circuit diagram of a capacitor cell.

FIG. 2 is a circuit diagram 200 of a capacitor cell. The capacitor cell includes a p-type metal oxide semiconductor (pMOS) transistor 202 and an n-type metal oxide semiconductor (nMOS) transistor 204. A source of the pMOS transistor 202 is connected to $V_{dd}$. A gate of the pMOS transistor 202 is connected to a drain of the nMOS transistor 204. A drain of the pMOS transistor 202 is connected to a gate of the nMOS transistor 204. A source of the nMOS transistor 204 is connected to $V_{ss}$. The capacitance of the capacitor cell is equal to $$1 / \left[ \left( \frac{1}{C_{psg}} \right) + \left( \frac{1}{C_{ndg} + C_{pgd}} \right) + \left( \frac{1}{C_{ngs}} \right) \right],$$

where $C_{psg}$ is the capacitance between the source and gate of the pMOS transistor 202, $C_{ndg}$ is the capacitance between the drain and gate of the nMOS transistor 204, $C_{pgd}$ is the capacitance between the gate and drain of the pMOS transistor 202, and $C_{ngs}$ is the capacitance between the gate and source of the nMOS transistor 204.

Figure 3:
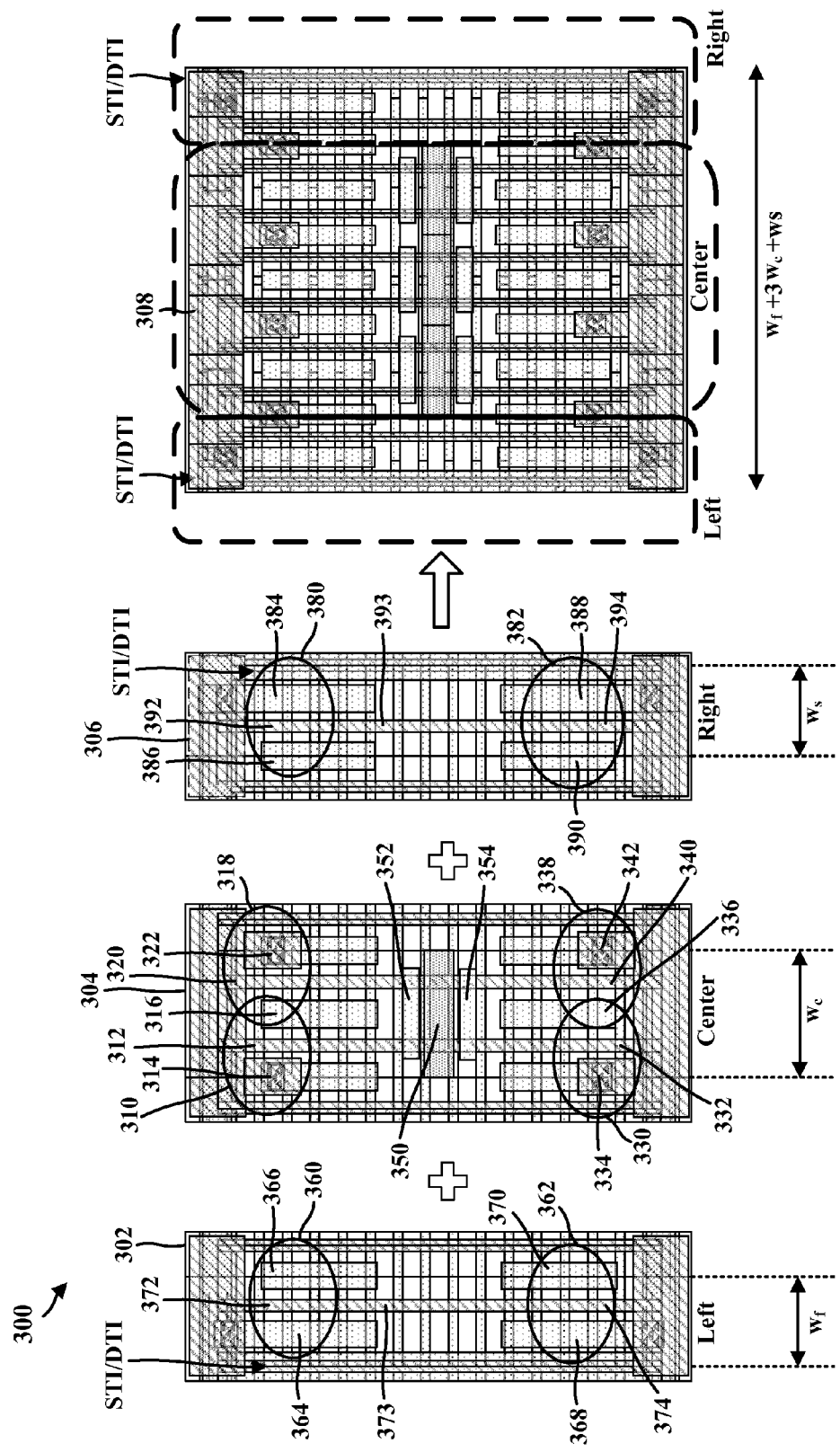
FIG. 3 is a first set of diagrams for illustrating an exemplary continuous diffusion configurable standard cell architecture.

FIG. 3 is a first set of diagrams 300 for illustrating an exemplary continuous diffusion configurable standard cell architecture. In the exemplary continuous diffusion configurable standard cell architecture, a configurable circuit cell may include one left cell 302 (also referred to as left subcell), one or more identical center cells 304 (also referred to as center subcell), and one right cell 306 (also referred to as right subcell). The dotted lines show the boundaries of each of the left cell 302, center cell 304, and right cell 306. The center cell 304 has a continuous active region (also referred to as diffusion region or oxide diffusion (OD) region) without any shallow trench isolation (STI) or deep trench isolation (DTI) regions that would separate the active region into two or more active regions. The left cell 302 has a continuous active region up to the left boundary at which an STI/DTI region is located. The right cell 306 has a continuous active region up to the right boundary at which an STI/DTI region is located. When the left cell 302, one or more center cells 304, and the right cell 306 are placed together (FIG. 3B), the entire cell 308 has a continuous active region with STI/DTI regions located only on the left and right boundaries of the cell. The cell 308 is shown with one left cell 302, three center cells 304, and one right cell 306.

Figure 4:
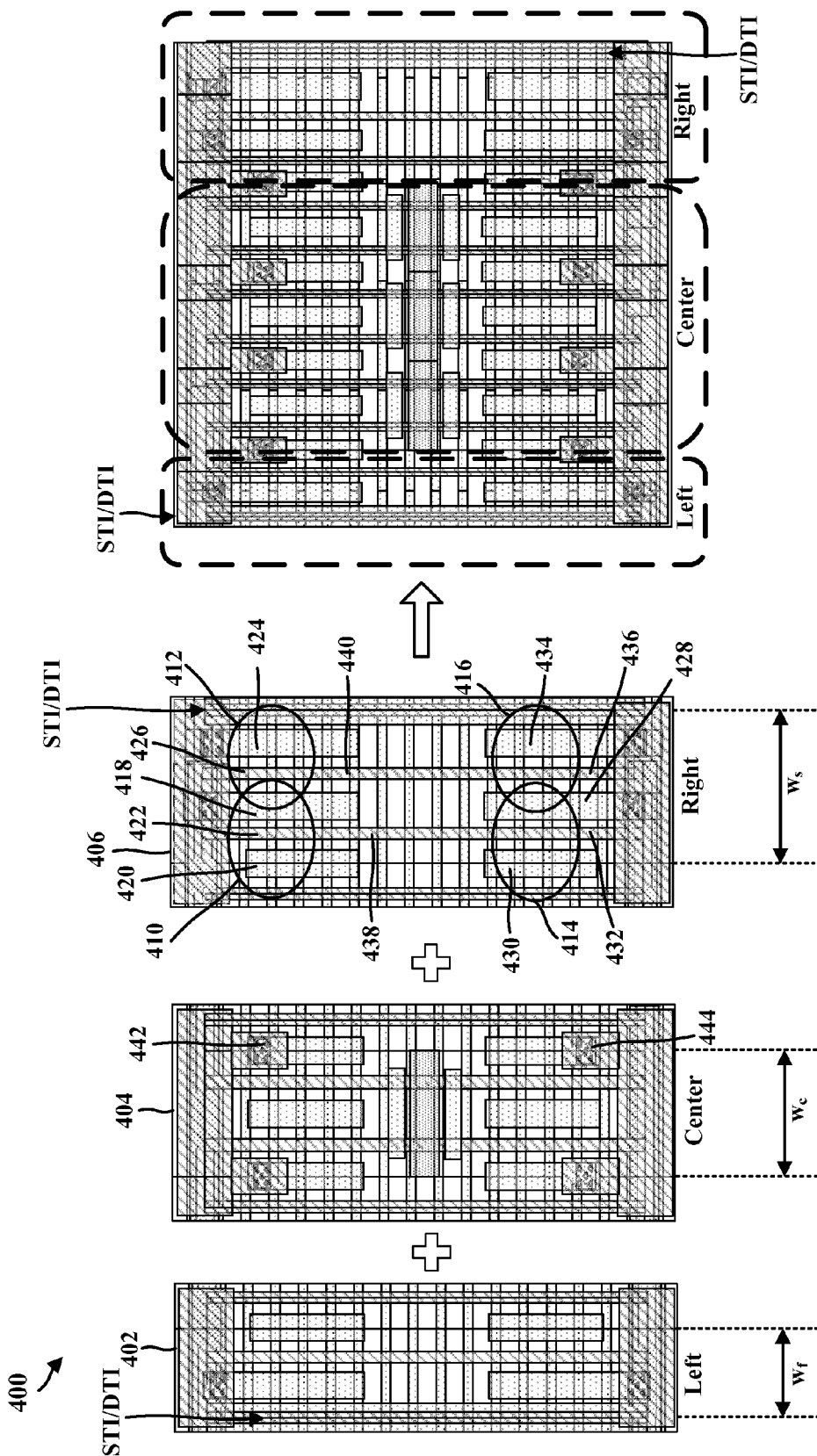
FIG. 4 is a second set of diagrams for illustrating an exemplary continuous diffusion configurable standard cell architecture.

The left cell 302 includes 1.5 grids (gate interconnects that extend lengthwise and parallel in the cell), the center cell 304 includes 2 grids, and the right cell 306 includes 1.5 grids (FIG. 3) or 2.5 grids (FIG. 4). In exemplary configurations, a configurable circuit cell may be manufactured on a semiconductor die to fill an entire space or gap between the aligned standard cells (see FIG. 1). For example, if a space/gap between aligned standard cells would allow a configurable circuit cell with x grids, a configurable circuit cell with x grids may be manufactured using the left cell 302, one or more center cells 304, and the right cell 306. Specifically, if x is an even integer, then a configurable circuit cell may be configured with (x−4)/2 center cells 304, one 1.5 grid left cell 302, and one 2.5 grid right cell 306, and if x is an odd integer, then a configurable circuit cell may be configured with (x−3)/2 center cells 304, one 1.5 grid left cell 302, and one 1.5 grid right cell 306.

The center cell 304 includes a first pMOS transistor 310 having a first pMOS transistor gate 312, a first pMOS transistor source 314, and a first pMOS transistor drain 316. The first pMOS transistor source 314 is coupled to $V_{dd}$. The center cell 304 further includes a second pMOS transistor 318 having a second pMOS transistor gate 320, a second pMOS transistor source 322, and a second pMOS transistor drain 316. The second pMOS transistor source 322 is also coupled to $V_{dd}$. The first pMOS transistor drain 316 and the second pMOS transistor drain 316 are the same drain. The center cell 304 further includes a first nMOS transistor 330 having a first nMOS transistor gate 332, a first nMOS transistor source 334, and a first nMOS transistor drain 336. The first nMOS transistor source 334 is coupled to $V_{ss}$ (e.g., ground). The center cell 304 further includes a second nMOS transistor 338 having a second nMOS transistor gate 340, a second nMOS transistor source 342, and a second nMOS transistor drain 336. The second nMOS transistor source 342 is also coupled to $V_{ss}$. The first nMOS transistor drain 336 and the second nMOS transistor drain 336 are the same drain.

The first pMOS transistor gate 312 and the first nMOS transistor gate 332 are formed of one gate interconnect (also referred to as "POLY" interconnect), and are therefore collinear. The gate interconnect is cut 350 (also referred to as cut POLY where the gate interconnect is cut in a mask) to separate the first pMOS transistor gate 312 and the first nMOS transistor gate 332. The second pMOS transistor gate 320 and the second nMOS transistor gate 340 are formed of one gate interconnect, and are therefore collinear. The gate interconnect is cut 350 to separate the second pMOS transistor gate 320 and the second nMOS transistor gate 340.

The center cell 304 further includes a metal POLY (MP) layer interconnect 352 coupling the first pMOS transistor gate 312 to the second pMOS transistor gate 320, and a second MP layer interconnect 354 coupling the first nMOS transistor gate 332 to the second nMOS transistor gate 340. The first and second pMOS transistors 310, 318 are connected in parallel, and the first and second nMOS transistors 330, 338 are connected in parallel.

The left cell 302 includes a pMOS transistor 360 and an nMOS transistor 362. The source 364 of the pMOS transistor 360 is connected to $V_{dd}$. The drain 366 of the pMOS transistor 360 is also connected to $V_{dd}$, as the drain 366 and the first pMOS transistor source 314 are the same. The source 368 of the nMOS transistor 362 is connected to $V_{ss}$. The drain 370 of the nMOS transistor 362 is also connected to $V_{ss}$, as the drain 370 and the first nMOS transistor source 334 are the same.

The gate 372 of the pMOS transistor 360 and the gate 374 of the nMOS transistor 362 are formed of one gate interconnect 373 that extends lengthwise across the left cell 302. The gate interconnect 373 forming the gates 372, 374 is unconnected to any signal line or voltage source, and is therefore floating. Accordingly, the pMOS transistor 360 and the nMOS transistor 362 are inactive, thus providing isolation in addition to the STI/DTI region at the boundary of the left cell 302, in order to further isolate the center cell 304 from adjacent standard cells. As discussed supra, the left cell 302 includes a break in the active region at the STI/DTI region at the boundary of the left cell 302.

The right cell 306 includes a pMOS transistor 380 and an nMOS transistor 382. The source 384 of the pMOS transistor 380 is connected to $V_{dd}$. The drain 386 of the pMOS transistor 380 is also connected to $V_{dd}$, as the drain 386 and the second pMOS transistor source 322 are the same. The source 388 of the nMOS transistor 382 is connected to $V_{ss}$. The drain 390 of the nMOS transistor 382 is also connected to $V_{ss}$, as the drain 390 and the second nMOS transistor source 342 are the same. The gate 392 of the pMOS transistor 380 and the gate 394 of the nMOS transistor 382 are formed of one gate interconnect 393 that extends lengthwise across the right cell 306. The gate interconnect 393 forming the gates 392, 394 is unconnected to any signal line or voltage source, and is therefore floating. Accordingly, the pMOS transistor 380 and the nMOS transistor 382 are inactive, thus providing isolation in addition to the STI/DTI region at the boundary of the right cell 306, in order to further isolate the center cell 304 from adjacent standard cells. As discussed supra, the right cell 306 includes a break in the active region at the STI/DTI region at the boundary of the right cell 306.

The configurable circuit cell, which includes a left cell 302, one or more center cells 304, and a right cell 306, has a configurable width w equal to $w_f+w_s+n*w_c$, where $w_f$ is a width of the left cell 302, $w_s$ is a width of the right cell 306, and $n*w_c$ is a width of the one or more center cells 304, and where n is a number of the center cells 304 and $w_c$ is a width of each center cell 304. For example, the configurable circuit cell 308 is configured with a width w equal to $w_f+w_s+3*w_c$. The width of the configurable circuit cell may be adjusted by changing n and/or by utilizing a 1.5 grid (FIG. 3) or 2.5 grid (FIG. 4) right cell 306 in order to maximize the size of the configurable circuit cell within the spaces/gaps between standard cells on a semiconductor die (see FIG. 1). Generally, the configurable circuit cell may be configurable to be located within a space/gap region of an integrated circuit after initial placement of standard cells (see FIG. 1). Further, if the space/gap region has a width $w_r$, then $w_f+w_s+n*w_c \leq w_r$ and $w_f+w_s+(n+1)*w_c > w_r$ for integer n. In such a configuration, the width $w_s$ of the right cell 306 is selected based on whether the space/gap between standard cells would support an odd number of grids (i.e., use 1.5 grid right cell 306) or an even number of grids (i.e., use 2.5 grid right cell 306), and subsequently, the number n of center cells 304 is selected to fill the space/gap.

FIG. 4 is a second set of diagrams 400 for illustrating an exemplary continuous diffusion configurable standard cell architecture. In FIG. 4, the left cell 402 and center cell 404 are identical to that shown in FIG. 3. However, the right cell 406 is illustrated with 2.5 grids rather than 1.5 grids. The right cell 406 includes a first pMOS transistor 410, a second pMOS transistor 412, a first nMOS transistor 414, and a second nMOS transistor 416. The source 418 of the first pMOS transistor 410 is connected to $V_{dd}$. The drain 420 of the first pMOS transistor 410 is also connected to $V_{dd}$, as the drain 420 and the source 442 of the rightmost pMOS transistor of the center cell 404 are the same. The source 428 of the first nMOS transistor 414 is connected to $V_{ss}$. The drain 430 of the first nMOS transistor 414 is also connected to $V_{ss}$, as the drain 430 and the source 444 of the rightmost nMOS transistor of the center cell 404 are the same. The gate 422 of the first pMOS transistor 410 and the gate 432 of the first nMOS transistor 414 are formed of one gate interconnect 438 that extends lengthwise across the right cell 406. The gate interconnect 438 forming the gates 422, 432 is unconnected to any signal line or voltage source, and is therefore floating.

The source 424 of the second pMOS transistor 412 is connected to $V_{dd}$. The drain 418 of the second pMOS transistor 412 is also connected to $V_{dd}$. The source 434 of the second nMOS transistor 416 is connected to $V_{ss}$. The drain 428 of the second nMOS transistor 416 is also connected to $V_{ss}$. The gate 426 of the second pMOS transistor 412 and the gate 436 of the second nMOS transistor 416 are formed of one gate interconnect 440 that extends lengthwise across the right cell 406. The gate interconnect 440 forming the gates 426, 436 is unconnected to any signal line or voltage source, and is therefore floating. Accordingly, the first pMOS transistor 410, the second pMOS transistor 412, the first nMOS transistor 414, and the second nMOS transistor 416 are inactive, thus providing isolation in addition to the STI/DTI region at the boundary of the right cell 406, in order to further isolate the center cell 404 from adjacent standard cells.

Figure 5:
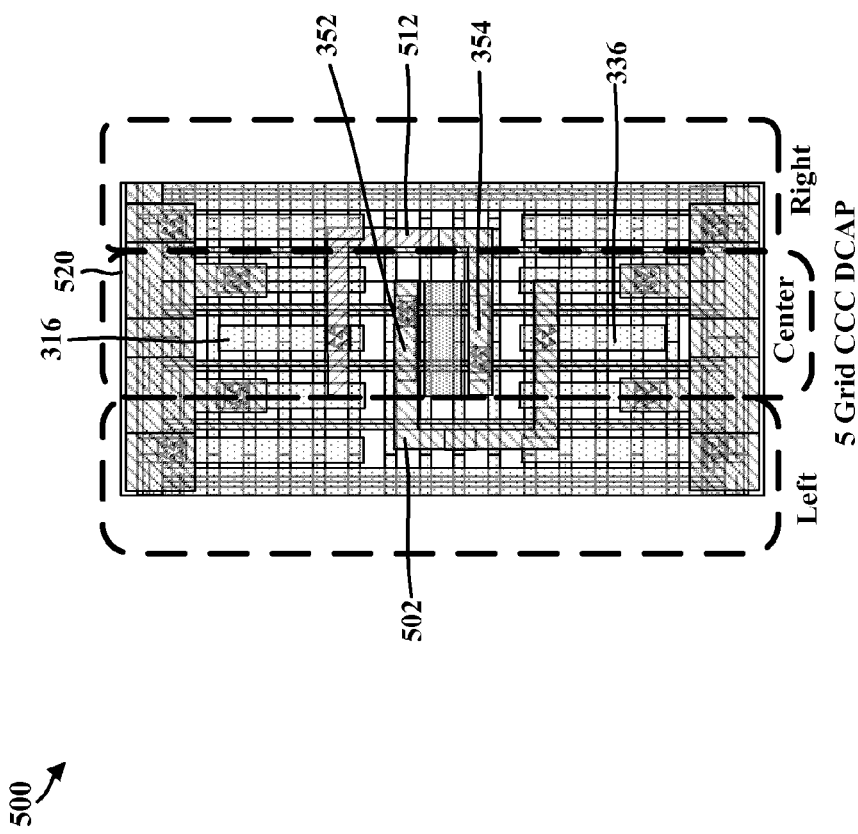
FIG. 5 is a diagram illustrating a five grid configurable circuit cell with one center subcell, a left subcell, and a right subcell that are configured as a capacitor cell.

FIG. 5 is a diagram 500 illustrating a five grid configurable circuit cell with one center subcell, a left subcell, and a right subcell that are configured as a capacitor cell 520. The capacitor cell 520 includes a metal 1 (M1) layer interconnect 502 coupling the MP layer interconnect 352 to the drain 336 of the first and second nMOS transistors 330, 338 (see FIG. 3). The capacitor cell 520 further includes an M1 layer interconnect 512 coupling the MP layer interconnect 354 to the drain 316 of the first and second pMOS transistors 310, 318 (see FIG. 3). The capacitor cell 520 is therefore interconnected as shown in the circuit diagram in FIG. 2, where the pMOS transistor 202 represents the first and second pMOS transistors 310, 318 connected in parallel, and the nMOS transistor 204 represents the first and second nMOS transistors 330, 338 connected in parallel.

Figure 6:
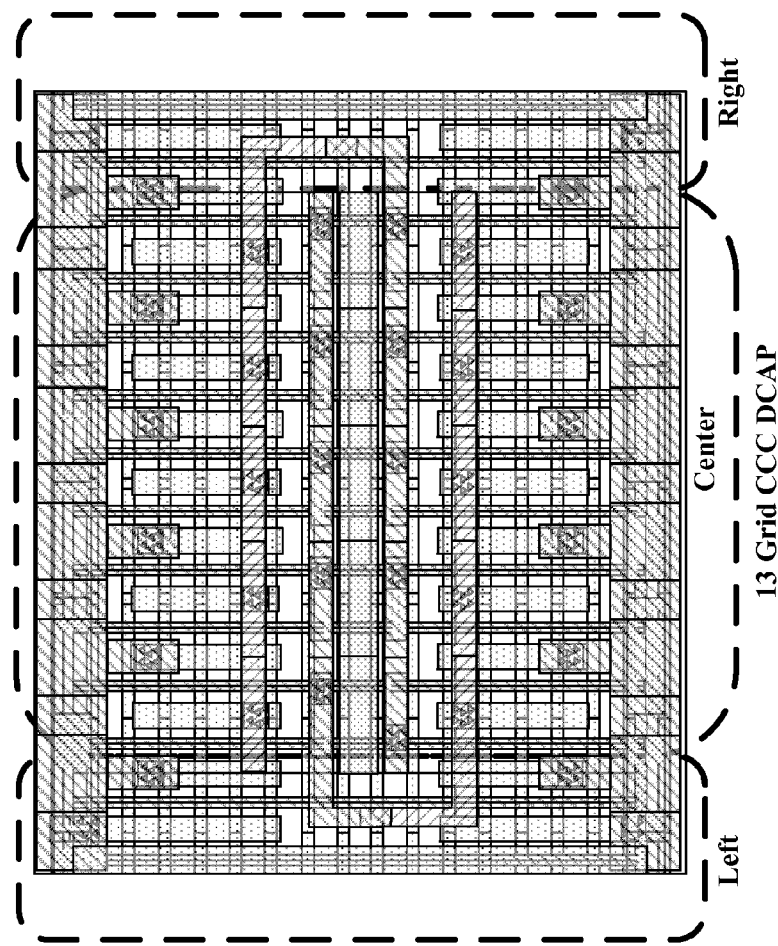
FIG. 6 is a diagram illustrating a thirteen grid configurable circuit cell with five center subcells, a left subcell, and a right subcell that are configured as a capacitor cell.
Figure 7:
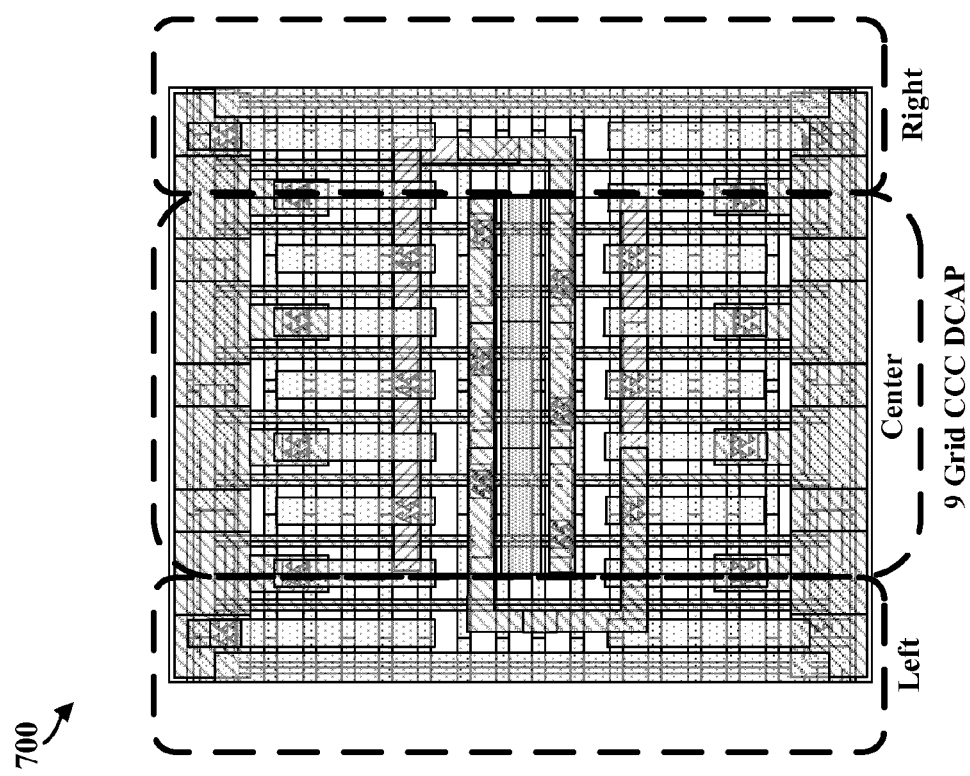
FIG. 7 is a diagram illustrating a nine grid configurable circuit cell configured as a capacitor cell.
Figure 8:
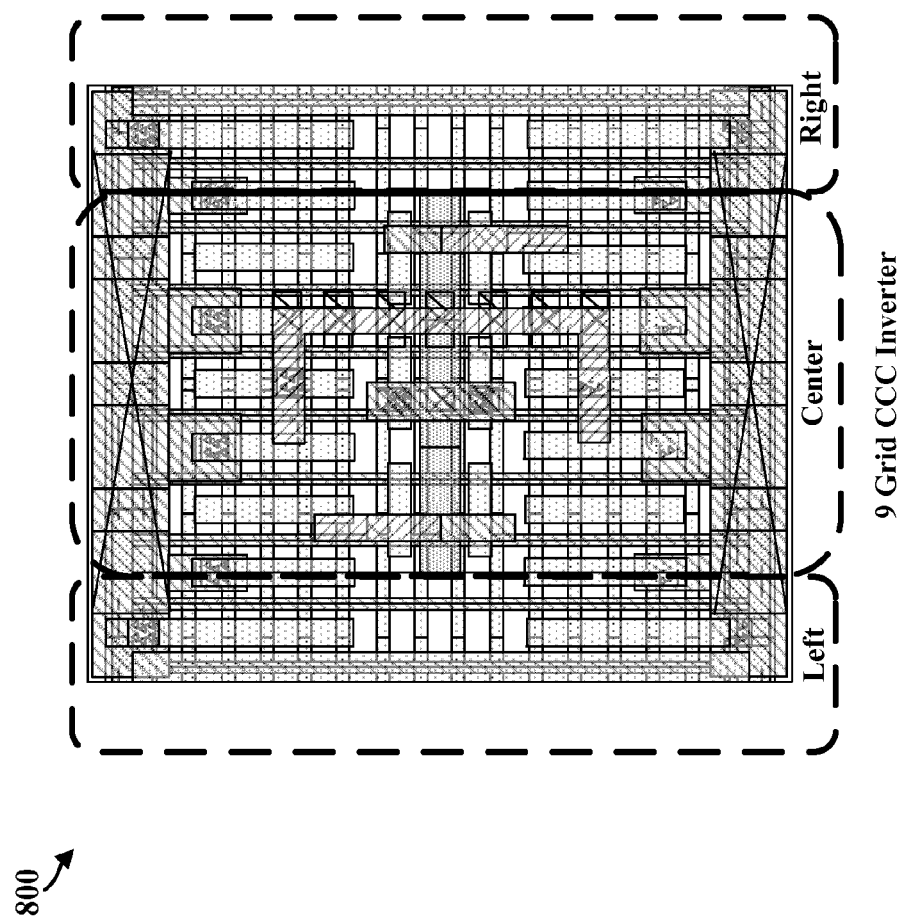
FIG. 8 is a diagram illustrating a nine grid configurable circuit cell configured as an inverter cell.
Figure 9:
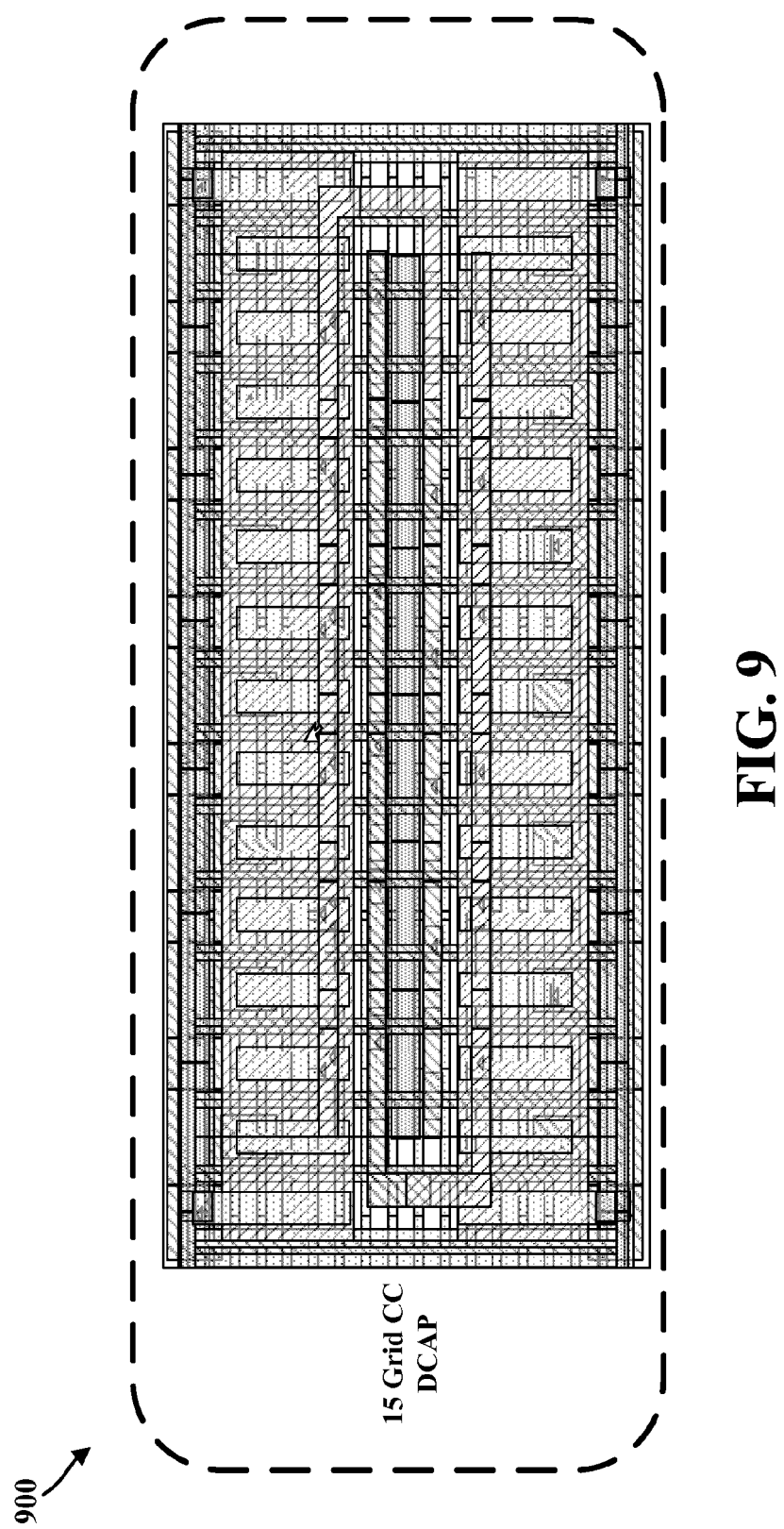
FIG. 9 is a diagram illustrating a fifteen grid configurable circuit cell configured as a capacitor cell.
Figure 10:
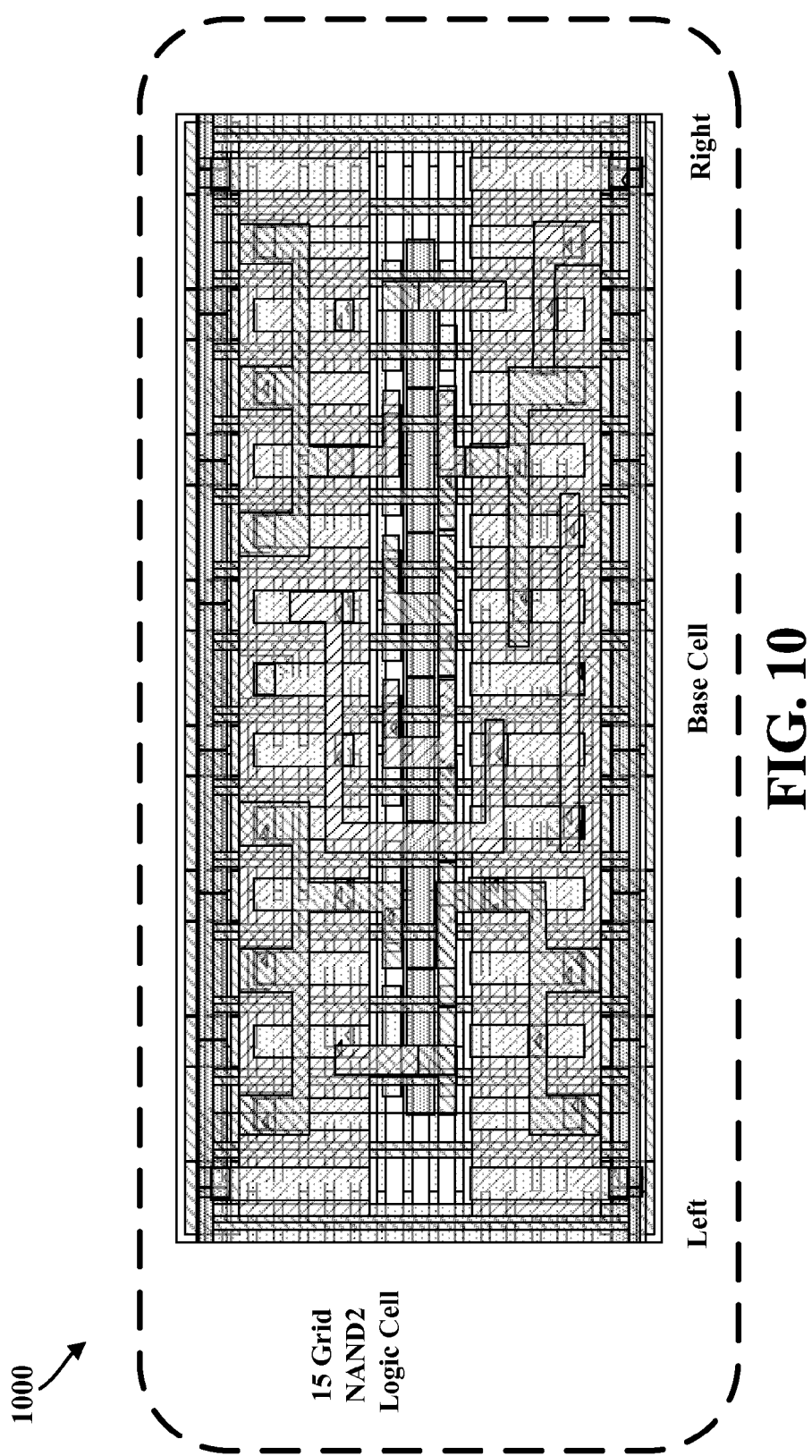
FIG. 10 is a diagram illustrating a fifteen grid configurable circuit cell configured as a NAND cell.
Figure 11:
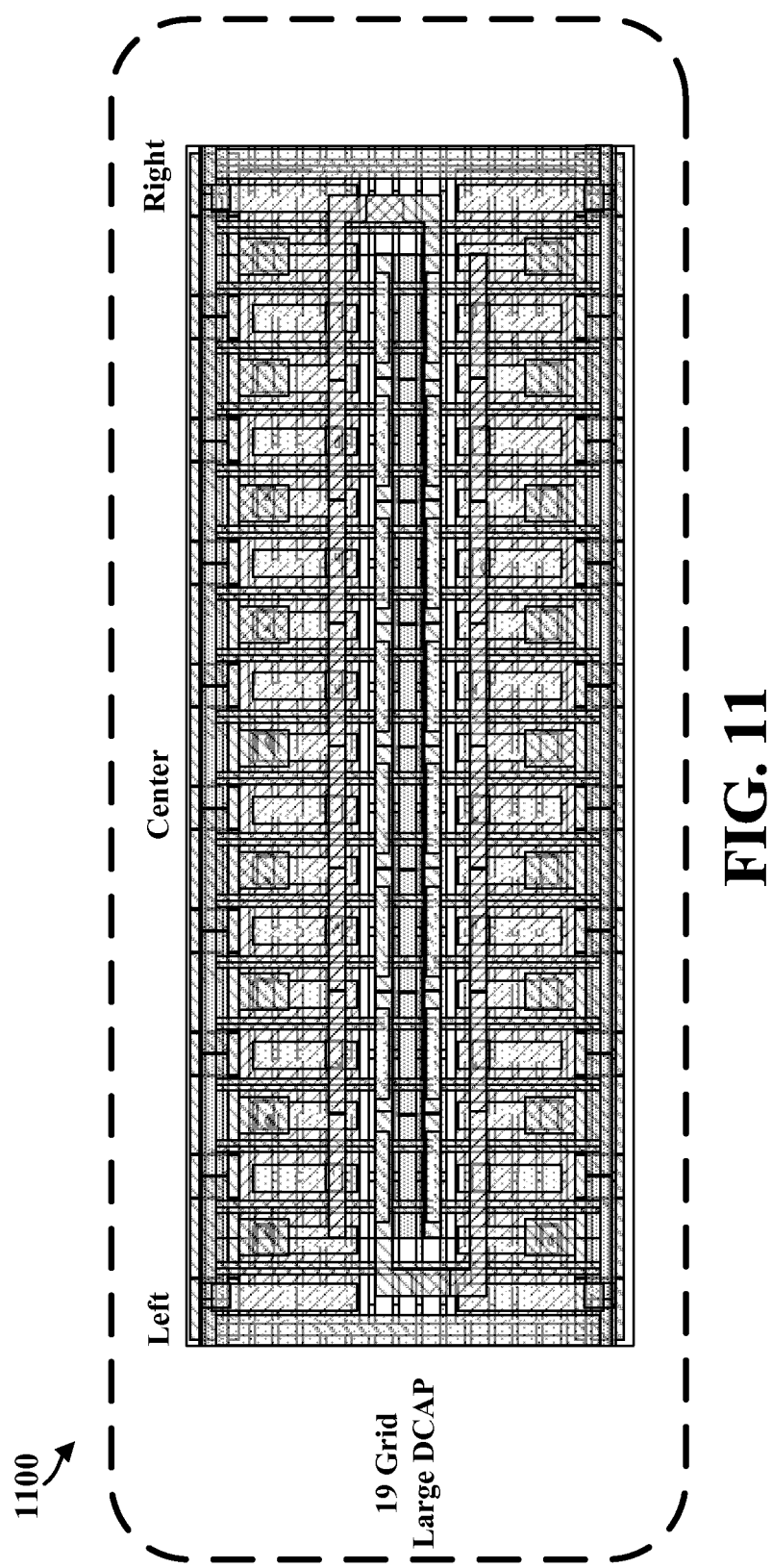
FIG. 11 is a diagram illustrating a nineteen grid configurable circuit cell configured as a capacitor cell.
Figure 12:
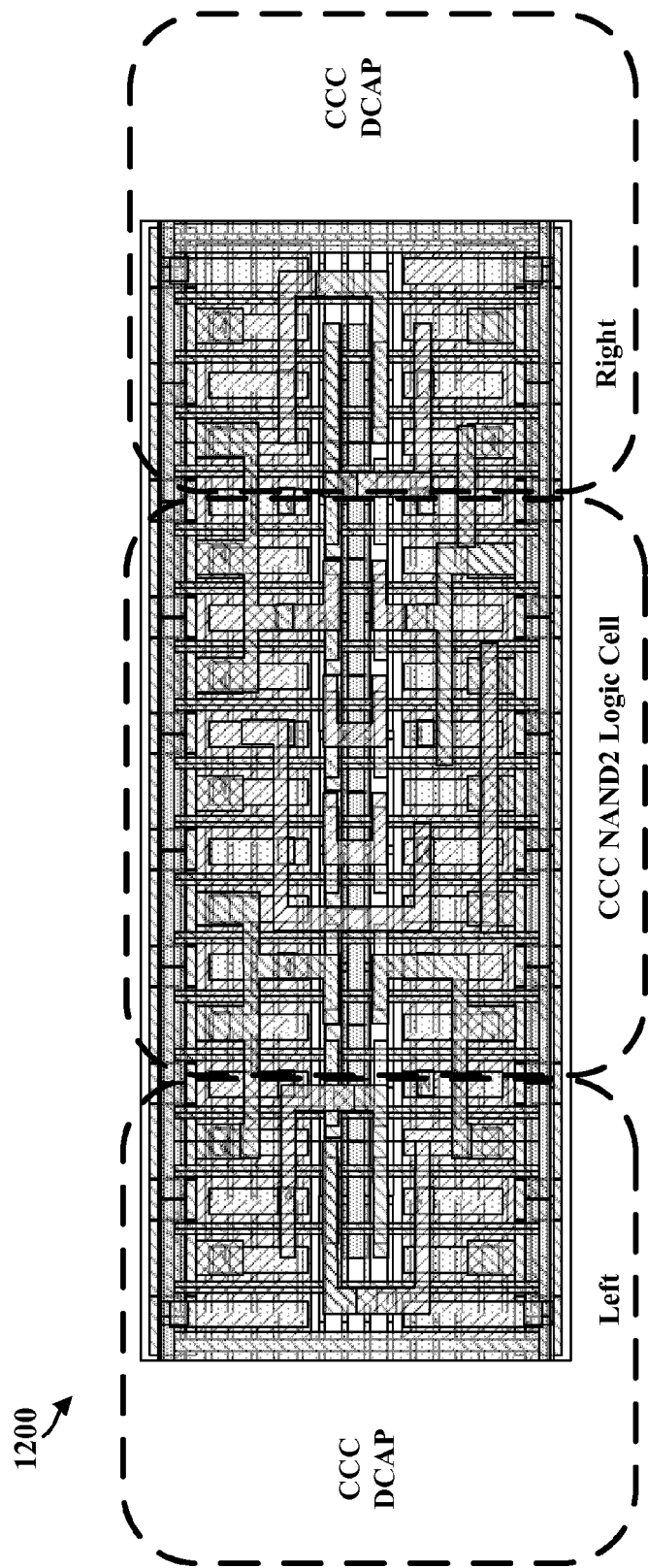
FIG. 12 is a diagram illustrating a nineteen grid configurable circuit cell configured as both a capacitor cell and a NAND cell.

FIG. 6 is a diagram 600 illustrating a thirteen grid configurable circuit cell with five center subcells, a left subcell, and a right subcell that are configured as a capacitor cell. FIG. 7 is a diagram 700 illustrating a nine grid configurable circuit cell configured as a capacitor cell. The capacitor cell in FIG. 7 includes one left cell, one right cell, and three center cells. FIG. 8 is a diagram 800 illustrating a nine grid configurable circuit cell configured as an inverter cell. The inverter cell in FIG. 8 includes one left cell, one right cell, and three center cells. FIG. 9 is a diagram 900 illustrating a fifteen grid configurable circuit cell configured as a capacitor cell. The capacitor cell in FIG. 9 includes one left cell, one right cell, and six center cells. FIG. 10 is a diagram 1000 illustrating a fifteen grid configurable circuit cell configured as a NAND cell. The NAND cell in FIG. 10 includes one left cell, one right cell, and six center cells. FIG. 11 is a diagram 1100 illustrating a nineteen grid configurable circuit cell configured as a capacitor cell. The capacitor cell in FIG. 11 includes one left cell, one right cell, and eight center cells. FIG. 12 is a diagram 1200 illustrating a nineteen grid configurable circuit cell configured as both a capacitor cell and a NAND cell. The capacitor/NAND cell in FIG. 12 includes one left cell, one right cell, and eight center cells. As demonstrated in FIG. 12, the exemplary configurable circuit cells may be configured to include a plurality of different circuit components, such as in this case, two separate coupling capacitors and one NAND gate.

Referring again to FIGS. 1, 3, a semiconductor die 102 includes at least one configurable circuit cell that includes at least one center subcell 304, a first side subcell 302 on a first side of the at least one center subcell 304, and a second side subcell 306 on a second side of the at least one center subcell 304. The at least one center subcell 304, the first side subcell 302, and the second side subcell 306 have a continuous active region. Each of the at least one center subcell 304 includes a first pMOS transistor 310 having a first pMOS transistor gate 312, a first pMOS transistor source 314, and a first pMOS transistor drain 316. The first pMOS transistor source 314 is coupled to a first voltage source (e.g., $V_{dd}$). Each of the at least one center subcell 304 further includes a second pMOS transistor 318 having a second pMOS transistor gate 320, a second pMOS transistor source 322, and a second pMOS transistor drain 316. The second pMOS transistor source 322 is coupled to the first voltage source. The first pMOS transistor drain 316 and the second pMOS transistor drain 316 are the same drain. Each of the at least one center subcell 304 further includes a first nMOS transistor 330 having a first nMOS transistor gate 332, a first nMOS transistor source 334, and a first nMOS transistor drain 336. The first nMOS transistor source 334 is coupled to a second voltage source (e.g., $V_{ss}$, ground). Each of the at least one center subcell 304 further includes a second nMOS transistor 338 having a second nMOS transistor gate 340, a second nMOS transistor source 342, and a second nMOS transistor drain 336. The second nMOS transistor source 342 is coupled to the second voltage source. The first nMOS transistor drain 336 and the second nMOS transistor drain 336 are the same drain.

The first pMOS transistor gate 312 and the first nMOS transistor gate 332 are separated and collinear, and the second pMOS transistor gate 320 and the second nMOS transistor gate 340 are separated and collinear. Each center subcell 304 further includes a first interconnect 352 coupling the first pMOS transistor gate 312 to the second pMOS transistor gate 320, and a second interconnect 354 coupling the first nMOS transistor gate 332 to the second nMOS transistor gate 340.

Referring to FIG. 5, when the configurable circuit cell is configured as a capacitor cell, the at least one configurable circuit cell further includes a third interconnect 502 coupling the first interconnect 352 to the first nMOS transistor drain 336 and to the second nMOS transistor drain 336, and a fourth interconnect 512 coupling the second interconnect 354 to the first pMOS transistor drain 316 and to the second pMOS transistor drain 316.

Referring again to FIG. 3, an edge of the continuous active region is within the first side subcell 302 such that the first side subcell 302 includes a break in the active region (at the STI/DTI region). Furthermore, an edge of the continuous active region is within the second side subcell 306 such that the second side subcell 306 includes a break in the active region (at STI/DTI region). The first side subcell 302 includes a first-side-subcell pMOS transistor 360 and a first-side-subcell nMOS transistor 362. The first-side-subcell pMOS transistor 360 has a first-side-subcell pMOS transistor gate 372, a first-side-subcell pMOS transistor source 364, and a first-side-subcell pMOS transistor drain 366. The first-side-subcell nMOS transistor 362 has a first-side-subcell nMOS transistor gate 374, a first-side-subcell nMOS transistor source 368, and a first-side-subcell nMOS transistor drain 370. The first-side-subcell pMOS transistor gate 372 and the first-side-subcell nMOS transistor gate 374 are formed of one gate interconnect 373 that extends across the configurable circuit cell. The first-side-subcell pMOS transistor source 364 is coupled to the first-side-subcell pMOS transistor drain 366 and to the first voltage source (both the first-side-subcell pMOS transistor source 364 and the first-side-subcell pMOS transistor drain 366 are coupled to the first voltage source (e.g., $V_{dd}$)). The first-side-subcell nMOS transistor source 368 is coupled to the first-side-subcell nMOS transistor drain 370 and to the second voltage source (both the first-side-subcell nMOS transistor source 368 and the first-side-subcell nMOS transistor drain 370 are coupled to the second voltage source (e.g., $V_{ss}$, ground)). The first-side-subcell pMOS transistor gate 372 and the first-side-subcell nMOS transistor gate 374 are floating.

The second side subcell 306 includes a first second-side-subcell pMOS transistor 380 and a first second-side-subcell nMOS transistor 382. The first second-side-subcell pMOS transistor 380 has a first second-side-subcell pMOS transistor gate 392, a first second-side-subcell pMOS transistor source 384, and a first second-side-subcell pMOS transistor drain 386. The first second-side-subcell nMOS transistor 382 has a first second-side-subcell nMOS transistor gate 394, a first second-side-subcell nMOS transistor source 388, and a first second-side-subcell nMOS transistor drain 390. The first second-side-subcell pMOS transistor gate 392 and the first second-side-subcell nMOS transistor gate 394 are formed of one gate interconnect 393 that extends across the configurable circuit cell. The first second-side-subcell pMOS transistor source 384 is coupled to the first second-side-subcell pMOS transistor drain 386 and to the first voltage source (both the first second-side-subcell pMOS transistor source 384 and the first second-side-subcell pMOS transistor drain 386 are coupled to the first voltage source (e.g., $V_{dd}$)). The first second-side-subcell nMOS transistor source 388 is coupled to the first second-side-subcell nMOS transistor drain 390 and to the second voltage source (both the first second-side-subcell nMOS transistor source 388 and the first second-side-subcell nMOS transistor drain 390 are coupled to the second voltage source (e.g., $V_{ss}$, ground)). The first second-side-subcell pMOS transistor gate 392 and the first second-side-subcell nMOS transistor gate 394 are floating.

Referring to FIG. 4, when the at least one configurable circuit cell includes a 2.5 grid right cell 406, the second side subcell 406 includes a first second-side-subcell pMOS transistor 410 and a first second-side-subcell nMOS transistor 414. The first second-side-subcell pMOS transistor 410 has a first second-side-subcell pMOS transistor gate 422, a first second-side-subcell pMOS transistor source 418, and a first second-side-subcell pMOS transistor drain 420. The first second-side-subcell nMOS transistor 414 has a first second-side-subcell nMOS transistor gate 432, a first second-side-subcell nMOS transistor source 428, and a first second-side-subcell nMOS transistor drain 430. The first second-side-subcell pMOS transistor gate 422 and the first second-side-subcell nMOS transistor gate 432 are formed of one gate interconnect 438 that extends across the configurable circuit cell. The first second-side-subcell pMOS transistor source 418 is coupled to the first second-side-subcell pMOS transistor drain 420 and to the first voltage source (both the first second-side-subcell pMOS transistor source 418 and the first second-side-subcell pMOS transistor drain 420 are coupled to the first voltage source (e.g., $V_{dd}$)). The first second-side-subcell nMOS transistor source 428 is coupled to the first second-side-subcell nMOS transistor drain 430 and to the second voltage source (both the first second-side-subcell nMOS transistor source 428 and the first second-side-subcell nMOS transistor drain 430 are coupled to the second voltage source (e.g., $V_{ss}$, ground)). The first second-side-subcell pMOS transistor gate 422 and the first second-side-subcell nMOS transistor gate 432 are floating. The second side subcell further includes a second second-side-subcell pMOS transistor 412 and a second second-side-subcell nMOS transistor 416. The second second-side-subcell pMOS transistor 412 has a second second-side-subcell pMOS transistor gate 426, a second second-side-subcell pMOS transistor source 424, and a second second-side-subcell pMOS transistor drain 418. The second second-side-subcell nMOS transistor 416 has a second second-side-subcell nMOS transistor gate 436, a second second-side-subcell nMOS transistor source 434, and a second second-side-subcell nMOS transistor drain 428. The second second-side-subcell pMOS transistor gate 426 and the second second-side-subcell nMOS transistor gate 436 are formed of one gate interconnect 440 that extends across the configurable circuit cell. The second second-side-subcell pMOS transistor source 424, the second second-side-subcell pMOS transistor drain 418, the first second-side-subcell pMOS transistor source 418, and the first second-side-subcell pMOS transistor drain 420 are all coupled together and to the first voltage source. The second second-side-subcell nMOS transistor source 434, the second second-side-subcell nMOS transistor drain 428, the first second-side-subcell nMOS transistor source 428, and the first second-side-subcell nMOS transistor drain 430 are all coupled together and to the second voltage source. The second second-side-subcell pMOS transistor gate 426 and the second second-side-subcell nMOS transistor gate 436 are floating.

As discussed supra, the configurable circuit cell has a configurable width w equal to $w_f + w_s + n*w_c$, wherein $w_f$ is a width of the first side subcell 302, $w_s$ is a width of the second side subcell 306, and $n*w_c$ is a width of the at least one center subcell, where n is a number of center subcells 304 of the at least one center subcell and $w_c$ is a width of each center subcell 304 of the center subcells. The configurable circuit cell is configurable to be located within a region of an integrated circuit, the region having a width $w_r$, wherein n is an integer such that $w_f + w_s + n*w_c \leq w_r$ and $w_f + w_s + (n+1)*w_c > w_r$ (see FIG. 1). The at least one center subcell may include a plurality of center subcells 304 that are each identical to each other. The semiconductor die may further include additional configurable circuit cells, where the configurable circuit cells have various numbers of center subcells. For example, the semiconductor die 102 may include two or more of the configurable circuit cells, such as for example, two or more of the configurable circuit cells illustrated in FIGS. 5-12. The configurable circuit cell and each of the additional configurable circuit cells may be nonadjacent to each other, as illustrated in FIG. 1. In one example, the configurable circuit cell may be one of a capacitor cell, buffer, inverter, flip flop, latch, AND gate, OR gate, NAND gate, or NOR gate.

As discussed supra, an exemplary continuous diffusion configurable standard cell architecture is provided in which configurable circuit cells may be constructed with a 1.5 grid left cell, a 1.5 grid or 2.5 grid right cell, and any number of 2 grid center cells in order to fill any space/gap between standard cells on a semiconductor die. Accordingly, the exemplary continuous diffusion configurable standard cell architecture may include four standard cells, including a 1.5 grid left cell, a 1.5 grid right cell, a 2.5 grid right cell, and a 2 grid center cell. With the four standard cells, any space/gap between standard cells on a semiconductor die may be filled by constructing one configurable circuit cell that includes one 1.5 grid left cell, one 1.5 grid or 2.5 grid right cell, and n center cells. The constructed configurable circuit cell has a continuous diffusion/active region, as STI/DTI regions are only located on the edge of the configurable circuit cell. The constructed configurable circuit cell may initially be configured as a capacitor cell. Later, upon testing of the ASICs on the semiconductor die, the configurable circuit cell may be reconfigured as a non-capacitor cell by changing a subset of the masks for metal layers above the MP layer.

The exemplary configurable circuit cell increases a transistor density of such cells. For example, assume that current configurable circuit cells are available with 7, 11, 19, or 35 grids. Assume also that a space/gap between standard cells is 18 grids. In such a situation, a 7 grid configurable circuit cell (with four pMOS transistors and four nMOS transistors) and an 11 grid configurable circuit cell (with eight pMOS transistors and 8 nMOS transistors) may be located in the space/gap. Alternatively, an exemplary 18 grid configurable circuit cell (with fourteen pMOS transistors and fourteen nMOS transistors) may be located in the space/gap, thus providing an additional two pMOS/nMOS transistors within the space/gap, and increasing a transistor density by 16% within the space/gap. In another example, assume that a space/gap between standard cells is 17 grids. In such a situation, two 7 grid configurable circuit cells (with eight total pMOS transistors and eight total nMOS transistors) may be located in the space/gap. Alternatively, an exemplary 17 grid configurable circuit cell (with fourteen pMOS transistors and fourteen nMOS transistors) may be located in the space/gap, thus providing an additional six pMOS/nMOS transistors within the space/gap, and increasing a transistor density by 75% within the space/gap. As is clear, a configurable circuit cell may be configured using the exemplary configurable circuit cell architecture with the four aforementioned standard cells (i.e., 1.5 grid left cell, 1.5 grid right cell, 2.5 grid right cell, and 2 grid center cell) to produce a configurable circuit cell occupying any number of grids. By filling the spaces/gaps between placed standard cells on a semiconductor die, a transistor density is increased within the configurable circuit cells in the spaces/gaps.

FIG. 13 is a flow chart 1300 of an exemplary method. The exemplary method is a method of operation of at least one configurable circuit cell on a semiconductor die. The at least one configurable circuit cell includes at least one center subcell, a first side subcell on a first side of the at least one center subcell, and a second side subcell on a second side of the at least one center subcell. At 1302, a current is flowed through a first pMOS transistor on the at least one center subcell. The first pMOS transistor has a first pMOS transistor gate, a first pMOS transistor source, and a first pMOS transistor drain. The first pMOS transistor source is coupled to a first voltage source. At 1304, a current is flowed through a second pMOS transistor on the at least one center subcell. The second pMOS transistor has a second pMOS transistor gate, a second pMOS transistor source, and a second pMOS transistor drain. The second pMOS transistor source is coupled to the first voltage source. The first pMOS transistor drain and the second pMOS transistor drain are the same drain. At 1306, a current is flowed through a first nMOS transistor on the at least one center subcell. The first nMOS transistor has a first nMOS transistor gate, a first nMOS transistor source, and a first nMOS transistor drain. The first nMOS transistor source is coupled to a second voltage source. At 1308, a current is flowed through a second nMOS transistor on the at least one center subcell. The second nMOS transistor has a second nMOS transistor gate, a second nMOS transistor source, and a second nMOS transistor drain. The second nMOS transistor source is coupled to the second voltage source. The first nMOS transistor drain and the second nMOS transistor drain are the same drain. The at least one center subcell, the first side subcell, and the second side subcell have a continuous active region.

In one configuration, a semiconductor die includes at least one configurable circuit cell. The at least one configurable circuit cell includes at least one center subcell, a first side subcell on a first side of the at least one center subcell, and a second side subcell on a second side of the at least one center subcell. The at least one configurable circuit cell includes means for flowing a current through a first pMOS transistor on the at least one center subcell. The means for flowing a current through a first pMOS transistor is the first pMOS transistor. The first pMOS transistor has a first pMOS transistor gate, a first pMOS transistor source, and a first pMOS transistor drain. The first pMOS transistor source is coupled to a first voltage source. The at least one configurable circuit cell further includes means for flowing a current through a second pMOS transistor on the at least one center subcell. The means for flowing a current through a second pMOS transistor is the second pMOS transistor. The second pMOS transistor has a second pMOS transistor gate, a second pMOS transistor source, and a second pMOS transistor drain. The second pMOS transistor source is coupled to the first voltage source. The first pMOS transistor drain and the second pMOS transistor drain are the same drain. The at least one configurable circuit cell further includes means for flowing a current through a first nMOS transistor on the at least one center subcell. The means for flowing a current through a first nMOS transistor is the first nMOS transistor. The first nMOS transistor has a first nMOS transistor gate, a first nMOS transistor source, and a first nMOS transistor drain. The first nMOS transistor source is coupled to a second voltage source. The at least one configurable circuit cell further includes means for flowing a current through a second nMOS transistor on the at least one center subcell. The means for flowing a current through a second nMOS transistor is the second nMOS transistor. The second nMOS transistor has a second nMOS transistor gate, a second nMOS transistor source, and a second nMOS transistor drain. The second nMOS transistor source is coupled to the second voltage source. The first nMOS transistor drain and the second nMOS transistor drain are the same drain. The at least one center subcell, the first side subcell, and the second side subcell have a continuous active region. If configured as a capacitor cell, the at least one configurable circuit cell may further include means for flowing a current through a third interconnect coupling the first interconnect to the first nMOS transistor drain and to the second nMOS transistor drain, and means for flowing a current through a fourth interconnect coupling the second interconnect to the first pMOS transistor drain and to the second pMOS transistor drain. The means for flowing a current through a third interconnect coupling the first interconnect to the first nMOS transistor drain and to the second nMOS transistor drain is the third interconnect. The means for flowing a current through a fourth interconnect coupling the second interconnect to the first pMOS transistor drain and to the second pMOS transistor drain is the fourth interconnect.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A semiconductor die comprising at least one configurable circuit cell comprising:
    at least one center subcell, each of the at least one center subcell comprising:
        a first p-type metal oxide semiconductor (pMOS) transistor having a first pMOS transistor gate, a first pMOS transistor source, and a first pMOS transistor drain, the first pMOS transistor source being coupled to a first voltage source;
        a second pMOS transistor having a second pMOS transistor gate, a second pMOS transistor source, and a second pMOS transistor drain, the second pMOS transistor source being coupled to the first voltage source, the first pMOS transistor drain and the second pMOS transistor drain being a same drain;
        a first n-type metal oxide semiconductor (nMOS) transistor having a first nMOS transistor gate, a first nMOS transistor source, and a first nMOS transistor drain, the first nMOS transistor source being coupled to a second voltage source; and
        a second nMOS transistor having a second nMOS transistor gate, a second nMOS transistor source, and a second nMOS transistor drain, the second nMOS transistor source being coupled to the second voltage source, the first nMOS transistor drain and the second nMOS transistor drain being a same drain;
    a first side subcell on a first side of the at least one center subcell; and
    a second side subcell on a second side of the at least one center subcell, the at least one center subcell, the first side subcell, and the second side subcell having a continuous active region.

2. The semiconductor die of claim 1, wherein the first pMOS transistor gate and the first nMOS transistor gate are separated and collinear, and the second pMOS transistor gate and the second nMOS transistor gate are separated and collinear.

3. The semiconductor die of claim 2, wherein each center subcell further comprises:

a first interconnect coupling the first pMOS transistor gate to the second pMOS transistor gate; and
a second interconnect coupling the first nMOS transistor gate to the second nMOS transistor gate.

4. The semiconductor die of claim 3, further comprising:
a third interconnect coupling the first interconnect to the first nMOS transistor drain and to the second nMOS transistor drain; and
a fourth interconnect coupling the second interconnect to the first pMOS transistor drain and to the second pMOS transistor drain.

5. The semiconductor die of claim 1, wherein an edge of the continuous active region is within the first side subcell such that the first side subcell includes a break in the active region.

6. The semiconductor die of claim 1, wherein an edge of the continuous active region is within the second side subcell such that the second side subcell includes a break in the active region.

7. The semiconductor die of claim 1, wherein:
the first side subcell comprises a first-side-subcell pMOS transistor and a first-side-subcell nMOS transistor;
the first-side-subcell pMOS transistor has a first-side-subcell pMOS transistor gate, a first-side-subcell pMOS transistor source, and a first-side-subcell pMOS transistor drain;
the first-side-subcell nMOS transistor has a first-side-subcell nMOS transistor gate, a first-side-subcell nMOS transistor source, and a first-side-subcell nMOS transistor drain;
the first-side-subcell pMOS transistor gate and the first-side-subcell nMOS transistor gate are formed of one gate interconnect that extends across the configurable circuit cell;
the first-side-subcell pMOS transistor source is coupled to the first-side-subcell pMOS transistor drain and to the first voltage source;
the first-side-subcell nMOS transistor source is coupled to the first-side-subcell nMOS transistor drain and to the second voltage source; and
the first-side-subcell pMOS transistor gate and the first-side-subcell nMOS transistor gate are floating.

8. The semiconductor die of claim 7, wherein:
the second side subcell comprises a first second-side-subcell pMOS transistor and a first second-side-subcell nMOS transistor;
the first second-side-subcell pMOS transistor has a first second-side-subcell pMOS transistor gate, a first second-side-subcell pMOS transistor source, and a first second-side-subcell pMOS transistor drain;
the first second-side-subcell nMOS transistor has a first second-side-subcell nMOS transistor gate, a first second-side-subcell nMOS transistor source, and a first second-side-subcell nMOS transistor drain;
the first second-side-subcell pMOS transistor gate and the first second-side-subcell nMOS transistor gate are formed of one gate interconnect that extends across the configurable circuit cell;
the first second-side-subcell pMOS transistor source is coupled to the first second-side-subcell pMOS transistor drain and to the first voltage source;
the first second-side-subcell nMOS transistor source is coupled to the first second-side-subcell nMOS transistor drain and to the second voltage source; and
the first second-side-subcell pMOS transistor gate and the first second-side-subcell nMOS transistor gate are floating.

9. The semiconductor die of claim 8, wherein:
the second side subcell further comprises a second second-side-subcell pMOS transistor and a second second-side-subcell nMOS transistor;
the second second-side-subcell pMOS transistor has a second second-side-subcell pMOS transistor gate, a second second-side-subcell pMOS transistor source, and a second second-side-subcell pMOS transistor drain;
the second second-side-subcell nMOS transistor has a second second-side-subcell nMOS transistor gate, a second second-side-subcell nMOS transistor source, and a second second-side-subcell nMOS transistor drain;
the second second-side-subcell pMOS transistor gate and the second second-side-subcell nMOS transistor gate are formed of one gate interconnect that extends across the configurable circuit cell;
the second second-side-subcell pMOS transistor source, the second second-side-subcell pMOS transistor drain, the first second-side-subcell pMOS transistor source, and the first second-side-subcell pMOS transistor drain are all coupled together and to the first voltage source;
the second second-side-subcell nMOS transistor source, the second second-side-subcell nMOS transistor drain, the first second-side-subcell nMOS transistor source, and the first second-side-subcell nMOS transistor drain are all coupled together and to the second voltage source; and
the second second-side-subcell pMOS transistor gate and the second second-side-subcell nMOS transistor gate are floating.

10. The semiconductor die of claim 1, wherein the configurable circuit cell has a configurable width w equal to $w_f + w_s + n*w_c$, wherein $w_f$ is a width of the first side subcell, $w_s$ is a width of the second side subcell, and $n*w_c$ is a width of the at least one center subcell, where n is a number of center subcells of the at least one center subcell and $w_c$ is a width of each center subcell of the center subcells.

11. The semiconductor die of claim 10, wherein the configurable circuit cell is configurable to be located within a region of an integrated circuit, the region having a width $w_r$, wherein n is an integer such that $w_f + w_s + n*w_c \leq w_r$ and $w_f + w_s + (n+1)*w_c > w_r$.

12. The semiconductor die of claim 1, wherein the at least one center subcell comprises a plurality of center subcells that are each identical to each other.

13. The semiconductor die of claim 1, further comprising additional configurable circuit cells, wherein the configurable circuit cells have various numbers of center subcells.

14. The semiconductor die of claim 13, wherein said configurable circuit cell and each of the additional configurable circuit cells are nonadjacent to each other.

15. The semiconductor die of claim 1, wherein the configurable circuit cell is one of a capacitor cell, buffer, inverter, flip flop, latch, AND gate, OR gate, NAND gate, or NOR gate.

16. A method of operation of at least one configurable circuit cell on a semiconductor die, the at least one configurable circuit cell comprising at least one center subcell, a first side subcell on a first side of the at least one center subcell, and a second side subcell on a second side of the at least one center subcell, comprising:
flowing a current through a first p-type metal oxide semiconductor (pMOS) transistor on the at least one center subcell, the first pMOS transistor having a first pMOS transistor gate, a first pMOS transistor source, and a first pMOS transistor drain, the first pMOS transistor source being coupled to a first voltage source;

flowing a current through a second pMOS transistor on the at least one center subcell, the second pMOS transistor having a second pMOS transistor gate, a second pMOS transistor source, and a second pMOS transistor drain, the second pMOS transistor source being coupled to the first voltage source, the first pMOS transistor drain and the second pMOS transistor drain being a same drain;

flowing a current through a first n-type metal oxide semiconductor (nMOS) transistor on the at least one center subcell, the first nMOS transistor having a first nMOS transistor gate, a first nMOS transistor source, and a first nMOS transistor drain, the first nMOS transistor source being coupled to a second voltage source; and flowing a current through a second nMOS transistor on the at least one center subcell, the second nMOS transistor having a second nMOS transistor gate, a second nMOS transistor source, and a second nMOS transistor drain, the second nMOS transistor source being coupled to the second voltage source, the first nMOS transistor drain and the second nMOS transistor drain being a same drain, wherein the at least one center subcell, the first side subcell, and the second side subcell have a continuous active region.

17. The method of claim 16, wherein the first pMOS transistor gate and the first nMOS transistor gate are separated and collinear, and the second pMOS transistor gate and the second nMOS transistor gate are separated and collinear.

18. The method of claim 17, wherein each center subcell further comprises:
a first interconnect coupling the first pMOS transistor gate to the second pMOS transistor gate; and
a second interconnect coupling the first nMOS transistor gate to the second nMOS transistor gate.

19. The method of claim 18, further comprising:
flowing a current through a third interconnect coupling the first interconnect to the first nMOS transistor drain and to the second nMOS transistor drain; and
flowing a current through a fourth interconnect coupling the second interconnect to the first pMOS transistor drain and to the second pMOS transistor drain.

20. The method of claim 16, wherein an edge of the continuous active region is within the first side subcell such that the first side subcell includes a break in the active region, and an edge of the continuous active region is within the second side subcell such that the second side subcell includes a break in the active region.

21. The method of claim 16, wherein the configurable circuit cell has a configurable width w equal to $w_f+w_s+n*w_c$, wherein $w_f$ is a width of the first side subcell, $w_s$ is a width of the second side subcell, and $n*w_c$ is a width of the at least one center subcell, where n is a number of center subcells of the at least one center subcell and $w_c$ is a width of each center subcell of the center subcells.

22. The method of claim 21, wherein the configurable circuit cell is configurable to be located within a region of an integrated circuit, the region having a width $w_r$, wherein n is an integer such that $w_f+w_s+n*w_c \leq w_r$ and $w_f+w_s+(n+1)*w_c > w_r$.

23. A semiconductor die including at least one configurable circuit cell, the at least one configurable circuit cell comprising at least one center subcell, a first side subcell on a first side of the at least one center subcell, and a second side subcell on a second side of the at least one center subcell, the at least one configurable circuit cell comprising:
means for flowing a current through a first p-type metal oxide semiconductor (pMOS) transistor on the at least one center subcell, the first pMOS transistor having a first pMOS transistor gate, a first pMOS transistor source, and a first pMOS transistor drain, the first pMOS transistor source being coupled to a first voltage source;

means for flowing a current through a second pMOS transistor on the at least one center subcell, the second pMOS transistor having a second pMOS transistor gate, a second pMOS transistor source, and a second pMOS transistor drain, the second pMOS transistor source being coupled to the first voltage source, the first pMOS transistor drain and the second pMOS transistor drain being a same drain;

means for flowing a current through a first n-type metal oxide semiconductor (nMOS) transistor on the at least one center subcell, the first nMOS transistor having a first nMOS transistor gate, a first nMOS transistor source, and a first nMOS transistor drain, the first nMOS transistor source being coupled to a second voltage source; and means for flowing a current through a second nMOS transistor on the at least one center subcell, the second nMOS transistor having a second nMOS transistor gate, a second nMOS transistor source, and a second nMOS transistor drain, the second nMOS transistor source being coupled to the second voltage source, the first nMOS transistor drain and the second nMOS transistor drain being a same drain, wherein the at least one center subcell, the first side subcell, and the second side subcell have a continuous active region.

24. The semiconductor die of claim 23, wherein the first pMOS transistor gate and the first nMOS transistor gate are separated and collinear, and the second pMOS transistor gate and the second nMOS transistor gate are separated and collinear.

25. The semiconductor die of claim 24, wherein each center subcell further comprises:
a first interconnect coupling the first pMOS transistor gate to the second pMOS transistor gate; and
a second interconnect coupling the first nMOS transistor gate to the second nMOS transistor gate.

26. The semiconductor die of claim 25, further comprising:
means for flowing a current through a third interconnect coupling the first interconnect to the first nMOS transistor drain and to the second nMOS transistor drain; and
means for flowing a current through a fourth interconnect coupling the second interconnect to the first pMOS transistor drain and to the second pMOS transistor drain.

27. The semiconductor die of claim 23, wherein an edge of the continuous active region is within the first side subcell such that the first side subcell includes a break in the active region, and an edge of the continuous active region is within the second side subcell such that the second side subcell includes a break in the active region.

28. The semiconductor die of claim 23, wherein the configurable circuit cell has a configurable width w equal to $w_f+w_s+n*w_c$, wherein $w_f$ is a width of the first side subcell, $w_s$ is a width of the second side subcell, and $n*w_c$ is a width of the at least one center subcell, where n is a number of center subcells of the at least one center subcell and $w_c$ is a width of each center subcell of the center subcells.

29. The semiconductor die of claim 28, wherein the configurable circuit cell is configurable to be located within a region of an integrated circuit, the region having a width $w_r$, wherein n is an integer such that $w_f+w_s+n*w_c \leq w_r$ and $w_f+w_s+(n+1)*w_c > w_r$.

* * * * *